(12) United States Patent
Higashiki

(10) Patent No.: US 6,262,792 B1
(45) Date of Patent: *Jul. 17, 2001

(54) OPTICAL EXPOSURE APPARATUS OF SCANNING EXPOSURE SYSTEM AND ITS EXPOSING METHOD

(75) Inventor: Tatsuhiko Higashiki, Fujisawa (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/772,120

(22) Filed: Dec. 20, 1996

(30) Foreign Application Priority Data

Dec. 26, 1995 (JP) .................................... 7-338868

(51) Int. Cl.⁷ .......................... G03B 27/42; G03B 27/68; G01B 11/01
(52) U.S. Cl. ................................ 355/52; 355/53; 356/399
(58) Field of Search ............................ 355/53; 356/399

(56) References Cited

U.S. PATENT DOCUMENTS

| | | | |
|---|---|---|---|
| 4,908,656 | * 3/1990 | Suwa et al. | 355/53 |
| 4,982,227 | * 1/1991 | Suzuki | 355/53 |
| 5,581,324 | * 12/1996 | Miyai et al. | 355/53 |
| 5,721,608 | * 2/1998 | Taniguchi | 355/53 |
| 5,742,067 | * 4/1998 | Imai | 250/548 |
| 5,801,815 | * 9/1998 | Takahasi | 355/53 |
| 5,801,816 | * 3/2000 | Shiraishi | 355/53 |
| 5,894,056 | * 4/1999 | Kakizaki et al. | 430/5 |
| 5,995,199 | * 11/1999 | Shinozaki et al. | 355/53 |
| 6,040,096 | * 3/2000 | Kakizaki et al. | 430/5 |

* cited by examiner

*Primary Examiner*—Christopher E. Mahoney
(74) *Attorney, Agent, or Firm*—Finnegan, Henderson, Farabow, Garrett & Dunner, L.L.P.

(57) ABSTRACT

In an optical exposure apparatus of a scan-exposure system, scan-exposure is preliminarily executed before an actual scan-exposure, and a reticle position measuring device measures a positional change of a reticle in the upper and lower direction with the movement of a reticle stage to a scanning direction. Then, a calculation circuit obtains correction data for an offset based on the measuring value to be stored in a memory. Thereafter, correction data stored in the memory is sequentially supplied to a feedback controlling circuit at an actual scan-exposure time. Also, a measuring value of the position of a wafer in a Z-axial direction with the movement of the wafer stage to the scanning direction, relatively moving with the reticle stage, is supplied to the feedback controlling circuit from a wafer position measuring device. The feedback controlling circuit controls a wafer Z-axial driving mechanism such that the position of the wafer in the Z-axial direction is offset by a positional change of the reticle in upper and lower directions. Thereby, correcting a shift of a projection image from a focal position at an exposure surface on the wafer due to deformation (curve and tilt) of the reticle and the upper and lower movement.

39 Claims, 7 Drawing Sheets

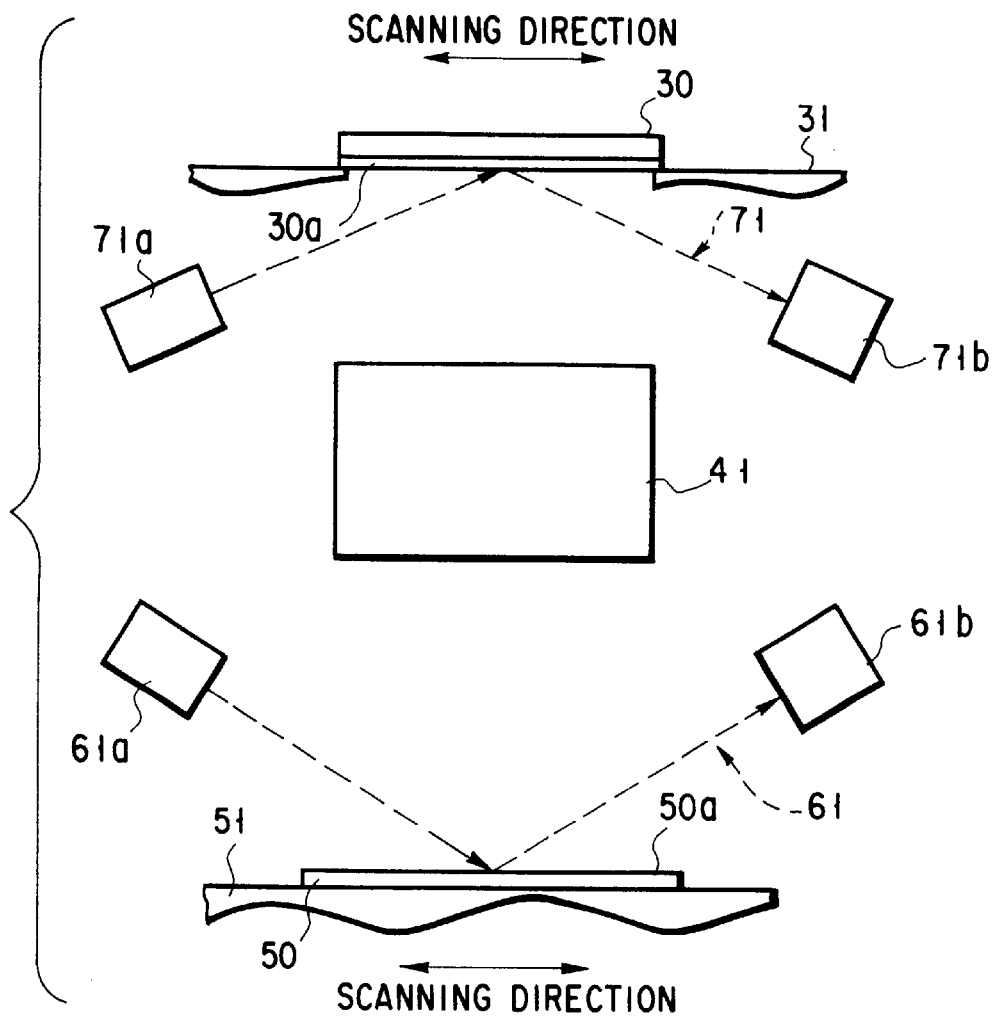
F I G. 3

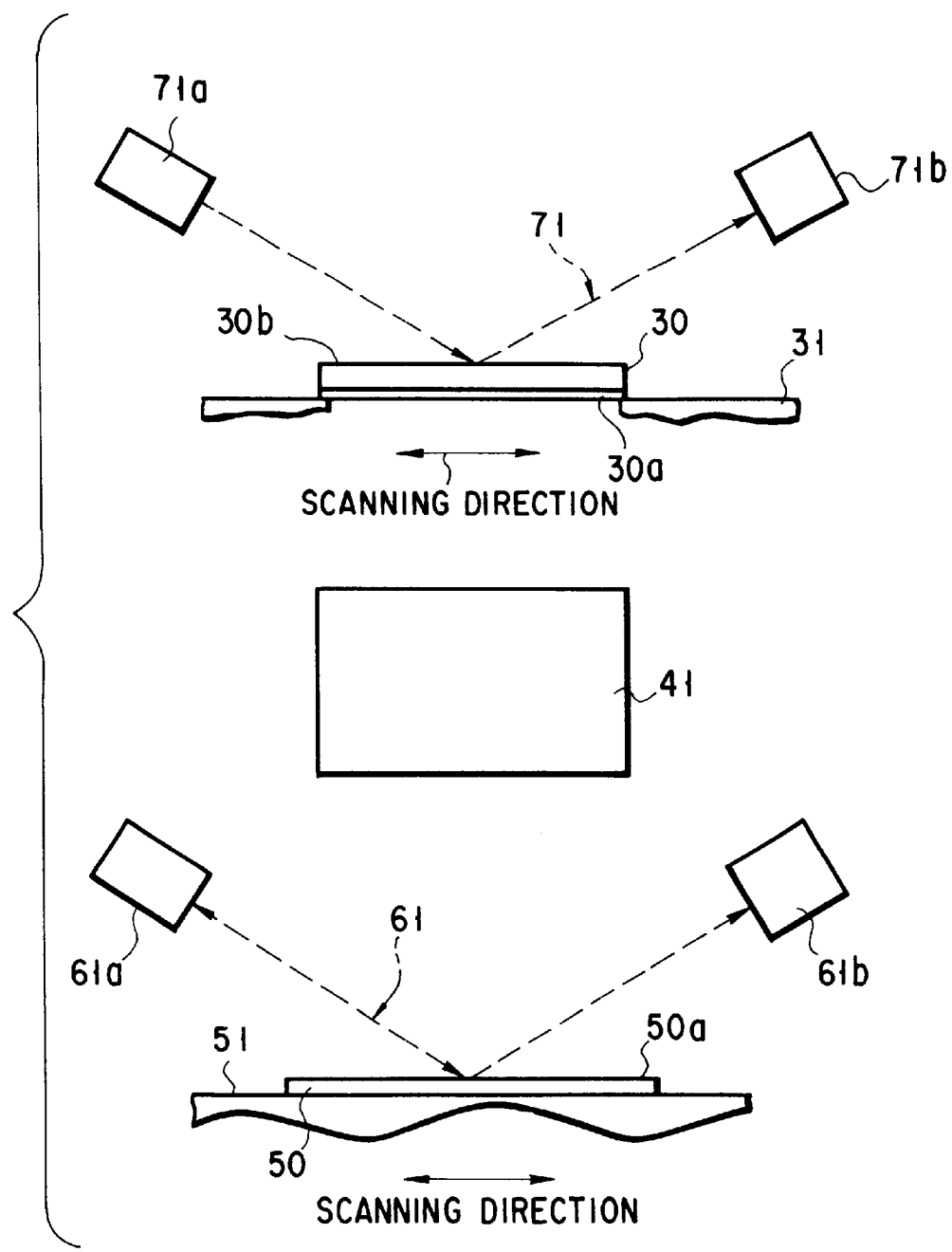
F I G. 6

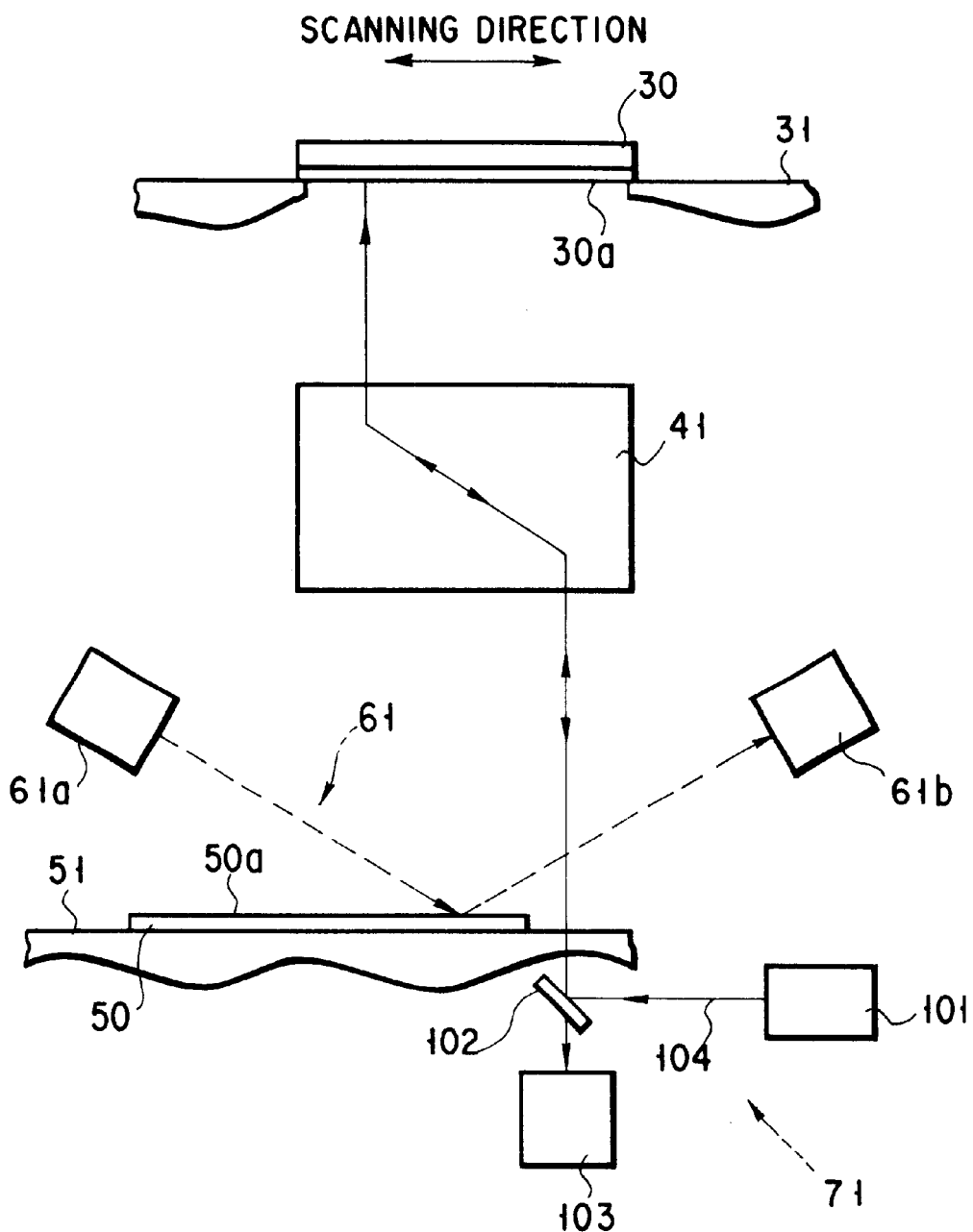
F I G. 7

OPTICAL EXPOSURE APPARATUS OF SCANNING EXPOSURE SYSTEM AND ITS EXPOSING METHOD

BACKGROUND OF THE INVENTION

The present invention relates to an optical exposure apparatus of a scan-exposure system for transferring a pattern image formed on a reticle onto a wafer as the reticle and the wafer are relatively moved, and its exposing method, and more particularly to improvement of the reduction of a DOF (Depth of Focus) of a projection lens, which is caused by deformation of the reticle and upper and lower movement of the reticle at the time of scanning exposure.

Generally, in a lithography process of a semiconductor manufacture, an optical stepper of a reduction projection type is used. In the current optical stepper, the minimal pattern pitch of a device can be formed to be a quarter micron.

In the optical stepper, RES (resolution) of the pattern pitch of the quarter micron was achieved by highly enlarging a numerical aperture of the projection lens and shortening an optical exposure wave length ($\lambda$) as shown in the following equation (1).

$$RES = k_1 \cdot (\lambda/NA) \quad (1)$$

$$DOF = \pm k_2 \cdot (\lambda/(NA)^2) \quad (2)$$

wherein each of $k_1$ and $k_2$ is a constant, and NA is a numerical aperture of the projection lens.

As shown in equation (2), if the numerical aperture NA of the projection lens is highly enlarged and the optical exposure wave length is shortened, the DOF of the projection lens is lowered. This causes a so-called defective resolution in which a pattern image formed on a reticle becomes dim on the exposure surface of a wafer. In order to solve this problem, it is required that the projection image from the reticle and the exposure surface of the wafer be focused on each other with high accuracy.

FIG. 1 shows a schematic structure of the conventional optical stepper to improve the reduction of DOF. Specifically, for example, a reticle 3 is irradiated with light from a light source 1 through a condenser lens 2. A pattern image formed on the reticle 3 is reduced by a projection lens 4 so as to be projected on a wafer 5. As a result, photoresist on the surface of the wafer 5 is exposed by the projection image (reduced pattern image) from the reticle 3. At this time, the position of the exposure surface of the wafer 5 is measured by a wafer position measuring device 6. To focus the projection image from the reticle 3 on the exposure surface of the wafer 5 with high accuracy, the position of the wafer 5 in the direction of an optical axis (Z-axis) is controlled in accordance with the measuring result of the wafer position measuring device 6. In other words, the wafer position measuring device 6 comprises an LED 6a and a PSD (position sensitive detector) 6b. The driving system (not shown) in the Z-axial direction of the wafer 5 is controlled such that the output of PSD 6b is always set to "0."

However, by the above-mentioned wafer position measuring device 6, there can be obtained only data of the position of the exposure surface of the wafer 5 in the Z-axial direction. In other words, by the measuring device 6, there can not be obtained data of the position of the pattern image forming surface on the reticle 3 in the Z-axial direction, that is, one of causes of reducing DOF. In the conventional optical stepper, there was used a so-called step and repeat system. Specifically, the reticle 3 is mounted on a fixing state (reticle stage) 3', the position of a movable stage (wafer stage) 5' where the wafer 5 is mounted in each of X- and Y-axial directions is changed every time when each exposure is performed. In the optical stepper of this type, the deformation (curve and tilt) of the reticle 3 and the upper and lower movement of the reticle 3 at the time of exposure can be ignored. For this reason, it was unnecessary to obtain data of the position of the pattern image forming surface on the reticle 3 in the Z-axial direction.

However, in order to make it possible to decrease the diameter of the projection lens, there has been recently developed a so-called optical exposure apparatus of a scan exposure type in which exposure is performed as the reticle and the wafer are relatively moved. In this type of the apparatus, the deformation of the reticle and the upper and lower movement of the reticle during the scan exposure have a great influence on the reduction of DOF. For example, if the amount of deformation in the Z-axial direction at the pattern image forming surface on the reticle is $\Delta Zm$, the change $\Delta Zw$ of a focal position at the exposure surface of the wafer can be expressed by the following equation (3).

$$\Delta Zw = \Delta Zm \cdot R^2 \quad (3)$$

wherein R is a reduction ratio of the projection lens.

More specifically, if the amount of deformation of the reticle $\Delta Zm$ is 2 $\mu$m, the change $\Delta Zw$ of the focal position at the exposure surface of the wafer is about 0.13 $\mu$m in the optical exposure apparatus of the scan exposure type whose reduction ratio of the projection lens is ¼. This value cannot be ignored in the lithography process of the memory device in which higher integration and higher density are expected. In other words, the reduction of DOF in the optical exposure apparatus will become more and more serious in improving the integration and the density of the device.

BRIEF SUMMARY OF THE INVENTION

An object of the present invention is to provide an optical exposure apparatus of a scan-exposure system, which can prevent a DOF (depth of focus) from being lowered by the position change of a reticle to the direction of an optical axis during a scan-exposure, and its exposing method.

In order to achieve the above object, according to the present invention, there is provided an optical exposure apparatus of a scan-exposure system for transferring a pattern image formed on a reticle onto a wafer as the reticle and the wafer are relatively moved, comprising:

reticle position measuring means for measuring the positional change of the reticle to the direction of an optical axis as the reticle is moved; and correcting means for correcting a shift of a pattern image from a focal position on an exposure surface of the wafer based on the measuring value obtained by the measuring means.

Also, according to the present invention, there is provided an optical exposure apparatus of a scan-exposure system comprising:

an optical system for reduction-projecting a pattern image formed on a reticle onto an exposure surface of a wafer;

a reticle stage, mounting the reticle thereon, provided to be movable in at least a scanning direction perpendicular to a direction of an optical axis of the optical system;

a wafer stage, mounting the wafer thereon, provided to be movable in the direction of the optical axis of the optical system and the scanning direction perpendicular to the direction of the optical axis of the optical system;

reticle position measuring means for measuring the positional change of the reticle in the direction of the optical axis of the optical system as the reticle stage is moved in the scanning direction; and correcting means for correcting the position of at least the wafer in the direction of the optical axis of the optical system based on the measuring value obtained by the reticle position measuring means.

Moreover, according to the present invention, there is provided an optical exposure apparatus of a scan-exposure system comprising:

an optical system for reduction-projecting a pattern image formed on a reticle onto an exposure surface of a wafer;

a reticle stage, mounting the reticle thereon, provided to be movable in the direction of an optical axis of the optical system and a scanning direction perpendicular to the direction of the optical axis of the optical system;

a wafer stage, mounting the wafer thereon, provided to be movable in at least the scanning direction perpendicular to the direction of the optical axis of the optical system;

reticle position measuring means for measuring the positional change of the reticle in the direction of the optical axis of the optical system as the reticle stage is moved in the scanning direction; and correcting means for correcting the position of at least the reticle in the direction of the optical axis of the optical system based on the measuring value obtained by the reticle position measuring means.

Further, according to the present invention, there is provided an optical exposure apparatus of a scan-exposure system comprising:

an optical system for reduction-projecting a pattern image formed on a reticle onto an exposure surface of a wafer;

a reticle stage, mounting the reticle thereon, provided to be movable in at least a scanning direction perpendicular to the direction of the optical axis of the optical system;

a wafer stage, mounting the wafer thereon, provided to be movable in at least the scanning direction perpendicular to the direction of the optical axis of the optical system;

reticle position measuring means for measuring the positional change of the reticle in the direction of the optical axis of the optical system as the reticle stage is moved in the scanning direction; and correcting means for correcting the position of at least the optical system in the direction of the optical axis based on the measuring value obtained by the reticle position measuring means.

Furthermore, according to the present invention, there is provided an exposing method of a scan-exposure system for scan-exposing a pattern image formed on a reticle onto a wafer to be transferred onto the wafer as the reticle and the wafer are relatively moved, comprising the steps of:

measuring a change of the position of the reticle to the direction of an optical axis as the reticle is moved in the scanning direction; and correcting a shift of the pattern image from a focal position of the pattern image on the exposure surface of the wafer based on the measuring value.

According to the optical exposure apparatus of a scan-exposure system and the exposure method, it is possible to correct the change of the focal position of the projection image on the exposure surface of the wafer, which is caused by deformation of the reticle and the upper and lower movement of the reticle during the scan-exposure. As a result, regardless of the positional change of the reticle to the direction of the optical axis, the projection image from the reticle and the exposure surface of the wafer are always focused, so that the scan-exposure can be executed.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 3 is a schematic view showing the main part of the structure of the optical exposure apparatus according to the first embodiment of the present invention;

FIG. 6 is a schematic view showing the other arrangement of the reticle position measuring device according to a second embodiment of the present invention;

FIG. 7 is a schematic view showing an example in a case where a laser interference system is used in the reticle position measuring device according to a third embodiment of the present invention;

DETAILED DESCRIPTION OF THE INVENTION

The following will explain the embodiments of the present invention with reference to the drawings.

Figure 1:
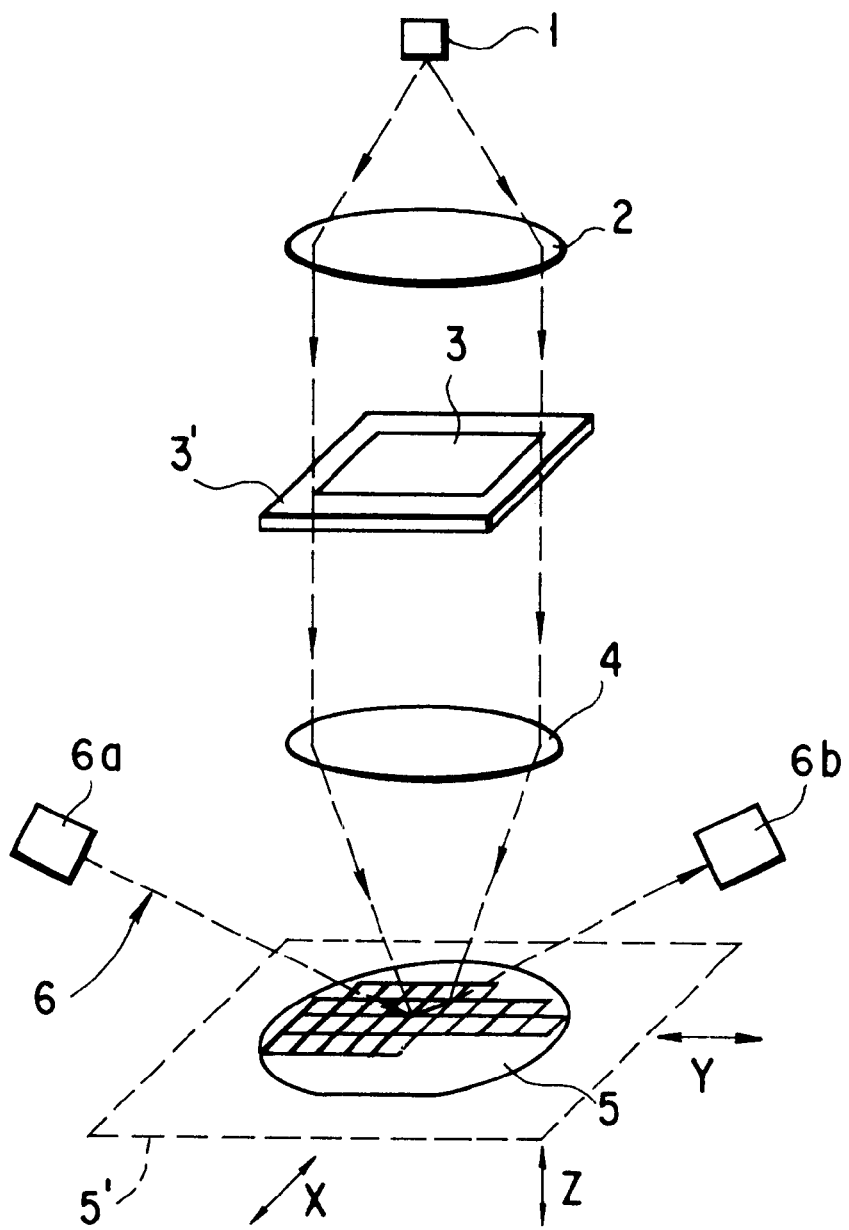
FIG. 1 is a schematic structural view of a conventional optical stepper to explain the prior art and its problem.
Figure 2:
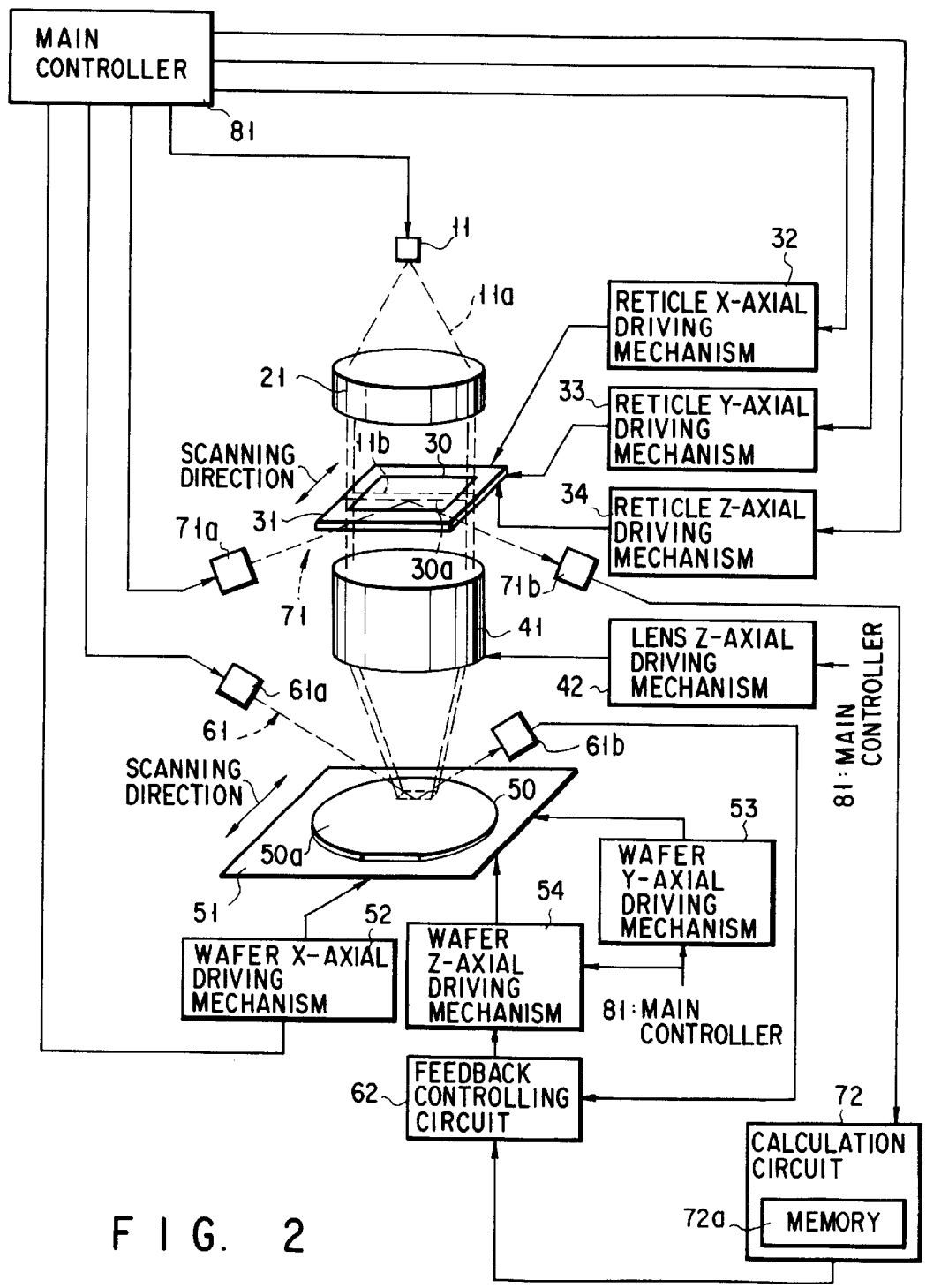
FIG. 2 is a structural view showing the outline of a reduction projection typed optical exposure apparatus of a scan exposure system according to a first embodiment of the present invention.

FIG. 2 is a structural view showing the outline of a reduction projection typed optical exposure apparatus of a scan exposure system according to a first embodiment of the present invention. Specifically, a reticle (glass mask) 30, serving a projection original plate, is irradiated with an exposure beam 11a in a slit form by a condenser lens 21. In this case, the beam 11a is emitted from a light source 11. A projection image from the reticle 30 of an irradiation area 11b is reduced by a projection lens (optical system) 41 so as to be projected on a wafer 50 in a slit form. At this time, the reticle 30 and the wafer 50 are relatively moved. Thereby, a pattern image, which is formed on the surface at the side of the projection lens 41 of the reticle 30 (surface 30a where the pattern image is formed), is gradually scanned so as to be projected on an exposure surface 50a on the wafer 50. In this case, photoresist is applied on the exposure surface 50a on the wafer 50. This photoresist is exposed by a reduction pattern image, which is projected through the projection lens 41. As a result, the entire pattern image on the reticle 30 is reduced at a predetermined magnification so as to be transferred onto the exposure surface 50a of the wafer 50.

As light source 11, there is used a mercury lamp for emitting light of g-ray or i-ray, which is effective to expose photoresist applied on the exposure surface 50a of the wafer 50.

The reticle 30 is mounted on a reticle stage 31 having a window (aperture), which is larger than the pattern image. The reticle stage 31 is provided to be movable in each of an X-axial direction, which is perpendicular to the direction of the optical axis of the beam 11a (direction of the optical axis of the projection lens 41), a Y-axial direction, and a Z-axial direction, which is parallel to the direction of the optical axis. For example, the movement of the reticle stage 31 in the X-axial direction, that is, the movement to the scanning direction is executed by a reticle X-axial driving mechanism 32. The movement of the reticle stage 31 in the Y-axial direction is executed by a reticle Y-axial driving mechanism 33. The movement of the reticle stage 31 in the Z-axial direction is executed by a reticle Z-axis driving mechanism 34.

The projection lens 41 is provided to be movable to the direction of the optical axis by a lens Z-axial driving mechanism 42.

The wafer 50 is mounted on a wafer stage 51. The wafer stage 51 is provided to be movable in each of X-, Y-, and Z-axial directions. For example, the movement of the wafer stage 51 in the X-axial direction, that is, the movement to the scanning direction is executed by a wafer X-axial driving mechanism 52. The movement of the wafer stage 51 in the Y-axial direction is executed by a wafer Y-axial driving mechanism 53. The movement of the wafer stage 51 in the Z-axial direction is executed by a wafer Z-axial driving mechanism 54.

A wafer position measuring device 61 is provided between the projection lens 41 and the wafer stage 51 to focus the projection image from the reticle 30 on the exposure surface 50a of the wafer 50 with high accuracy. For example, the wafer position measuring device 61 comprises an LED 61a, which emits light to the exposure surface 50a of the wafer 50, and a PSD (position sensitive detector) 61b, which receives the reflected light. PSD 61b measures the position of the wafer 50 in the Z-axial direction with the movement of the wafer stage 51 to the scanning direction (data of the position of the exposure surface 50a of the wafer 50 to the Z-axial direction). For example, PSD 61b electrically detects a difference between a position where the reflected light is received at a focus time and a position where the reflected light is received at a non-focus time in accordance with the position of the exposure surface 50a in the direction of the optical axis.

An output of PSD 61b is supplied to a feedback controlling circuit 62. The feedback controlling circuit 62 controls the wafer Z-axial driving mechanism 54 to correct the difference in the position of the reflected light based on the output from the PDS 61b. Moreover, data for an offset is supplied to the feedback controlling circuit 62 from a calculation circuit 72 to be described later.

A reticle position measuring device 71 is provided between the reticle stage 31 and the projection lens 41 to focus the projection image from the reticle 30 on the exposure surface 50a of the wafer 50 with high accuracy. For example, the reticle position measuring device 71 comprises an LED 71a, which emits light to a pattern image forming surface 30a on the reticle 30, and a PSD 71b, which receives the reflected light. PSD 71b measures the position of the reticle 30 in the Z-axial direction as the reticle stage 31 is moved in the scanning direction (data of the position of the pattern image forming surface 30a of the reticle 30 to the Z-axial direction). For example, based on the difference in the position of the reflected light, PDS 71b electrically detects the deformation (curve and tilt) of the reticle 30 during the scanning exposure. Also, PSD 71b detects the positional change of the reticle 30 in the Z-axial direction caused by the upper and lower movement of the reticle 30 during the scanning exposure.

An output of PSD 71b is supplied to the calculation circuit 72. The calculation circuit 72 calculates a correction value to control the position of the wafer 50 in the Z-axial direction based on the output of PSD 71b. The correction value obtained by the calculation circuit 72 is supplied to the feedback controlling circuit 62 as data for an offset.

In the first embodiment of the present invention, a memory 72a is provided to store the correction value to the calculation circuit 72. Specifically, the correction value, which is obtained by preliminarily performing the scan exposure, is stored in the memory 72a in advance. Then, the correction value is read at an actual scan exposure time so as to be supplied to the feedback controlling circuit 62. In other words, before the scan exposure is started, the reticle stage 31 is moved in a scanning direction. At this time, the reticle position measuring device 71 measures the positional change of the reticle 30 in the Z-axial direction. Then, the correction value is obtained by the calculation circuit 72 based on the measured value so as to be stored in the memory 72a as data for an offset. Thereafter, at the actual scan exposure time, data of the memory 72a is sequentially supplied to the feedback controlling circuit 62 with the movement of the reticle stage 31 to the scanning direction. Then, the feedback controlling circuit 62 controls the wafer Z-axial driving mechanism 54 in accordance with not only the position of the wafer 50 in the Z-axial direction but also the position of the reticle 30 in the Z-axial direction. As a result, at the time when the wafer 50 is moved in the scanning direction, the movement of the wafer stage 51 in the Z-axial direction is controlled such that the exposure surface 50a is offset by a variation of the position of the reticle 30 in the Z-axial direction from the position (difference) where the projection image from the reticle 30 and the exposure surface 50a are focused on each other.

In the above-structured optical exposure apparatus, the operation of each part is controlled by a main controller 81. For example, the main controller 81 controls the light source 11, the driving mechanisms 32, 33, 34, 42, 52, 53, and 54, the wafer position measuring device 61, and the reticle position measuring device 71.

Each of the driving mechanisms 32, 33, 34, 42, 52, 53, and 54 comprises one or a plurality of motors or one or a plurality of piezoelectric elements. Particularly, the driving mechanism 54 comprises a plurality of piezoelectric elements such that the wafer stage 51 can be independently driven to be tilted at multi points. In this case, the wafer 50 positioned in the Z-axial direction can be tilted in an arbitrary direction at an arbitrary angle.

FIG. 3 is a schematic view showing the main part of the structure of the reduction projection typed optical exposure apparatus of the scan exposure system. Specifically, in the spatial portion between the projection lens 41 and the wafer stage 51, LED 61a and PSD 61b are provided along the scanning direction. Then, with the movement of the wafer stage 51 to the scanning direction, the PSD 61b sequentially receives light, which is emitted from LED 61a and reflected at the exposure surface 50a of the wafer 50.

On the other hand, in the spatial portion between the projection lens 41 and the reticle stage 31, LED 71a and PSD 71b are provided along the scanning direction. Then, with the movement of the reticle stage 31 to the scanning direction, PSD 71b sequentially receives light, which is emitted from LED 71a and reflected at the pattern image forming surface 30a of the reticle 30.

Figure 4:
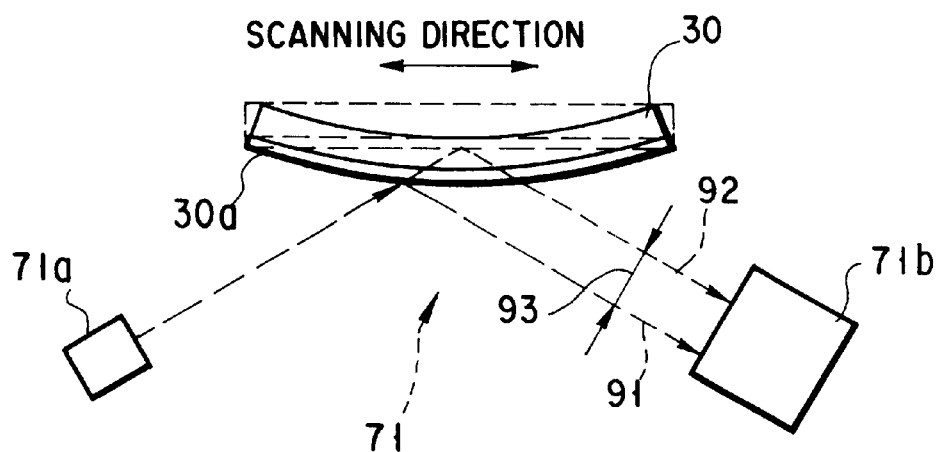
FIG. 4 is a schematic view showing a measuring operation of a reticle position measuring device in a case where there is deformation in a reticle according to the first embodiment of the present invention.

FIG. 4 is a schematic view showing the measuring operation of the reticle position measuring device 71 in a case where there is deformation in the reticle 30. Specifically, if there is deformation (concave warp in this case) in the reticle 30, light is reflected at the pattern image forming surface 30a to be made incident to PSD 71b through an optical passage 91. If there is no deformation in the reticle 30, light is also reflected at the pattern image forming surface 30a to be made incident to PSD 71b through an optical passage 92. Then, a difference 93 in the optical passage is generated between the optical passages 91 and 92 in accordance with the amount of deformation. The difference 93 is electrically detected by PSD 71b, so that the amount of deformation $\Delta Zm$ of the reticle 30 can measured. The amount of deformation $\Delta Zm$ can be obtained as a function $\Delta Zm$ (x,y) of the position of the reticle 30 in x and y directions. Therefore, the wafer Z-axial driving mechanism 54 is offset by the amount corresponding to the function $\Delta Zm$ (x,y) at the scan exposure time, so that the position of the wafer 50 in the Z-axial direction can be corrected in accordance with the deformation of the reticle 30. As a result, it is possible to decrease the deterioration of DOF (depth of focus) of the projection lens 41, which is caused by the positional change of the reticle 30 in the Z-axial direction in accordance with the deformation of the reticle 30.

Figure 5:
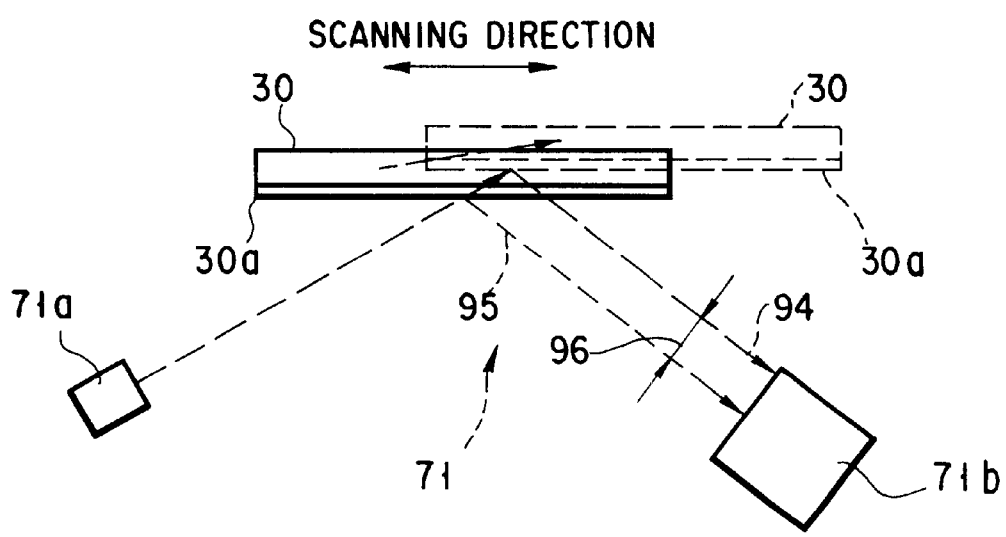
FIG. 5 is a schematic view showing a measuring operation of the reticle position measuring device in a case where the reticle is moved up and down according to the first embodiment of the present invention.

FIG. 5 is a schematic view showing the measuring operation of the reticle position measuring device 71 in a case where the reticle 30 is moved up and down in the scanning direction. Specifically, if the reticle 30 is moved up and down, light is made incident to PSD 71b through an optical passage 94. If the reticle 30 is not moved up and down, light is also made incident to PSD 71b through an optical passage 95. Then, a difference 96 in the optical passage is generated between the optical passages 94 and 95 in accordance with the upper and lower movement of the reticle 30. The difference 96 is electrically detected by PSD 71b, so that the upper and lower movement $\Delta Zm$ of the reticle 30 can measured. The upper and lower movement $\Delta Zm$ can be obtained as a function $\Delta Zm$ (x,y) of the position of the reticle 30 in x and y directions. Therefore, the wafer Z-axial driving mechanism 54 is offset by the amount corresponding to the function $\Delta Zm$ (x,y) at the scan exposure time, so that the position of the wafer 50 in the Z-axial direction can be corrected in accordance with the upper and lower movement of the reticle 30. As a result, it is possible to reduce the deterioration of DOF (depth of focus) of the projection lens 41, which is caused by the positional change of the reticle 30 in the Z-axial direction due to the upper and lower movement of the reticle 30.

According to the above-structured reduction projection typed exposure apparatus of the scan exposure system, it is possible to correctly obtain data of the position of the pattern image forming surface 30a of the reticle 30 at the scan exposure time. As a result, the position of the exposure surface 50a of the wafer 50 is corrected in accordance with the positional change of the pattern image forming surface 30a of the reticle 30, so that the deterioration of DOF can be improved.

Thus, the shift of the focal position of the projection image on the exposure surface of the wafer, which is caused by the deformation of the reticle or the upper and lower movement during the scan exposure, can be corrected. In other words, it is possible to obtain not only data of the position of the exposure surface of the wafer but also data of the position of the pattern image forming surface of the reticle at the scan exposure time. As a result, the scan exposure can be executed in a state that the projection image from the reticle and the exposure surface of the wafer are always focused on each other. Therefore, it is possible to prevent the DOF of the projection lens from being reduced by the deformation of the reticle and the upper and lower movement during the scan exposure.

The first embodiment explained the case in which the position of the wafer 50 in the Z-axial direction was controlled in accordance with the deformation of the reticle 30 and the upper and lower movement during the scan exposure. The present invention is not limited to the above embodiment. The shift of the focal position from the projection image on the exposure surface 50a of the wafer 50 from the reticle 30 can be also corrected by controlling the position of the reticle 30 and the projection lens 41 in the Z-axial direction. This can be easily realized by providing the wafer position measuring device 61, the feedback controlling circuit 62, the reticle position measuring device 71, and the calculation circuit 72 in each of the reticle Z-axial driving mechanism 34 and the lens Z-axial driving mechanism 42. Moreover, the control of the position in the Z-axial direction is not limited to one of three elements, that is, the wafer 50, the reticle 30, and the projection lens 41. For example, if three elements or two of any elements in the Z-axial direction are controlled at the same time, a higher accurate correction can be executed.

In the above-mentioned embodiment, as a method for correcting the shift of the focal position from the projection image on the exposure surface 50a of the wafer 50 from the reticle 30, the following method was explained.

The correction value was obtained based on the measuring value of the position of the reticle 30 obtained by preliminarily executing the scan exposure. Then, the obtained correction value was read at the actual scan exposure.

Other than the above-mentioned method, the correction of the shift can be executed by obtaining the correction value at a real time based on the measuring value of the position of the reticle 30 obtained at the actual scan exposure.

The use of the reticle position measuring device 71 is not limited to the case in which the position of the reticle 30 can be measured from the pattern image forming surface 30a.

A second embodiment of the present invention will explain as follows.

Specifically, as shown in FIG. 6, the LED 71a and the PSD 71b are provided at the upper portion of the reticle 30 (condenser lens side) so that the position of the reticle 30 can be measured from the glass surface 30b (pattern image non-forming surface).

As the wafer position measuring device 61, and the reticle position measuring device 71, there can be used mechanical sensor.

A third embodiment of the present invention will explain as follows.

Specifically, as shown in FIG. 7, the reticle position measuring device 71 may comprises a laser interference system 101, a half mirror 102, and a light receiver 103, etc. In other words, a laser beam 104 sent from the laser interference system 101 is reflected by the half mirror 102. Thereafter, the reticle 30 is irradiated with the reflected beam through the projection lens 41. With the movement of the reticle stage 31 to the scanning direction, the reflected light from the pattern image forming surface 30a is received by the receiver 103 through the projection lens 41 and the half mirror 102. In this case, it is possible to measure the change of the position of the reticle 30, which is caused by the deformation of the reticle 30 and the upper and lower movement, through the projection lens 41. As a result, distortion, which the projection lens 41 has, can be corrected at the same time.

The present invention is not limited to the case in which the reticle position measuring device 71 measures the change of the position of the reticle 30 at one point.

A fourth embodiment of the present invention will explain as follows.

Figure 8A:
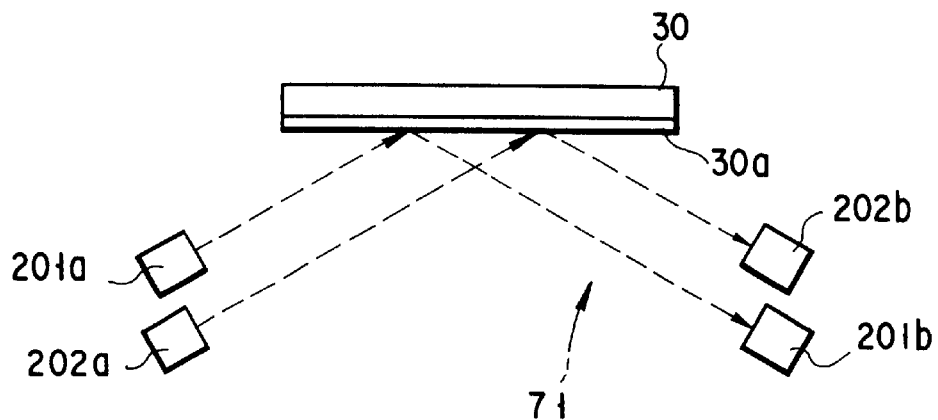
FIGS. 8A and 8B are schematic view showing the other structure of the reticle position measuring device according to a fourth embodiment of the present invention.
Figure 8B:
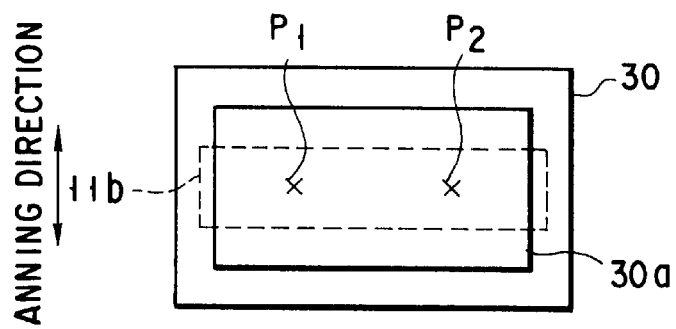

Specifically, as shown in FIGS. 8A and 8B, two pairs of LEDs 201a, 202a and PSD 201b, 202b are prepared as the reticle position measuring device 71. Then, each of two points P1 and P2 of the pattern image forming surface 30a may be measured. Thus, higher accurate correction can be executed by increasing the number of measuring points.

A fifth embodiment of the present invention will explain as follows.

Figure 9:
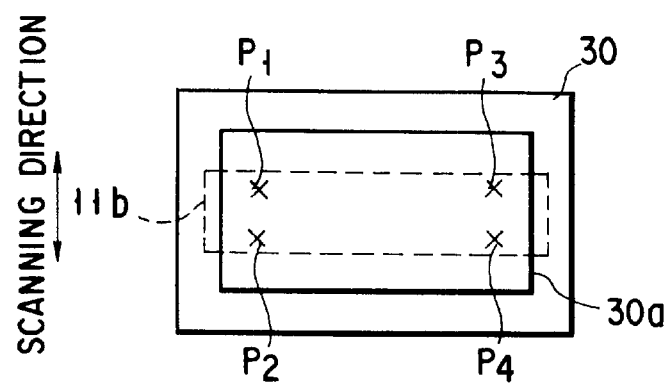
FIG. 9 is a schematic view showing the other structure of the reticle position measuring device according to a fifth embodiment of the present invention.

Specifically, as shown in FIG. 9, the shift of the focal position of the projection image from the reticle 30 may be corrected based on each of the measuring values of four points P1, P2, P3, and P4 of the pattern image forming surface 30a. In this case, it is possible to correct the shift of the focal position on the exposure surface 50a of the wafer 50, which is caused by the tilt to the diagonal direction of the reticle 30 or its torsion other than the deformation and the upper and lower movement.

The invention in its broader aspect is not limited to the specific details and representative devices shown and described herein. Accordingly, various modifications may be made without departing from the spirit or scope of the general inventive concept as defined by the appended claims and their equivalents.

Additional advantages and modifications will readily occur to those skilled in the art. Therefore, the invention in its broader aspects is not limited to the specific details, representative embodiments shown and described herein. Accordingly, various modifications may be made without departing from the spirit or scope of the general inventive concept as defined by the appended claims and their equivalents.

What is claimed is:

1. An optical exposure apparatus of a scan-exposure system for transferring a pattern image formed on a reticle onto a wafer as said reticle and said wafer are relatively moved, comprising:
   reticle position measuring means for measuring the positional change of a surface of a pattern image forming portion of said reticle in the direction of an optical axis as said reticle is moved; and
   correcting means for correcting a shift of a pattern image from a focal position on an exposure surface of said wafer based on said measuring value obtained by said measuring means.

2. The apparatus according to claim 1, wherein said reticle position measuring means measures the positional change of said reticle at at least one point.

3. The apparatus according to claim 1, wherein said reticle position measuring means optically measures the positional change of a pattern image forming surface on said reticle.

4. The apparatus according to claim 1, wherein said reticle position measuring means measures the positional change of a pattern image forming surface on said reticle through an optical system for reduction-projecting said pattern image.

5. The apparatus according to claim 1, wherein said reticle position measuring means applies a light beam to a surface of said reticle facing the wafer, receives the light beam reflected from the surface and measures the positional change of the reticle from the light beam received.

6. The apparatus according to claim 1, wherein said correcting means includes driving means for changing the position of said reticle in the direction of the optical axis.

7. The apparatus according to claim 1, wherein said correcting means includes driving means for changing the position of said wafer in the direction of the optical axis.

8. The apparatus according to claim 1, wherein said correcting means includes driving means for changing the position of a system for reduction-projecting said pattern image in the direction of the optical axis.

9. The apparatus according to claim 1, wherein said correcting means includes wafer position measuring means for measuring the positional change of said wafer to the direction of the optical axis.

10. The apparatus according to claim 1, wherein said correcting means further includes adjusting means having a calculation section for calculating a correction value in accordance with the measuring value obtained by said reticle position measuring means.

11. The apparatus according to claim 10, wherein said adjusting means comprises a storing means for storing a correction value in advance when the pattern image on the reticle is preliminarily scan-exposed.

12. The apparatus according to claim 10, wherein said correcting means further includes controlling means for controlling said driving means by providing said correction value as an offset to said controlling means.

13. An optical exposure apparatus of a scan-exposure system, comprising:
   an optical system for reduction-projecting a pattern image formed on a reticle onto an exposure surface of a wafer;
   a reticle stage, mounting said reticle thereon, provided to be movable in at least a scanning direction perpendicular to the direction of the optical axis of said optical system;
   a wafer stage, mounting said wafer thereon, provided to be movable in the direction of the optical axis of said optical system and the scanning direction perpendicular to the direction of the optical axis of said optical system;
   reticle position measuring means for measuring the position change of a surface of a pattern image forming portion of said reticle in the direction of the optical axis of said optical system as said reticle stage is moved in the scanning direction; and
   correcting means for correcting the position of at least said wafer in the direction of the optical axis of said optical system based on the measuring value obtained by said reticle position measuring means.

14. The apparatus according to claim 13, wherein said reticle position measuring means measures the positional change of said reticle at at least one point.

15. The apparatus according to claim 13, wherein said reticle position measuring means optically measures the positional change of a pattern image forming surface on said reticle.

16. The apparatus according to claim 13, wherein said reticle position measuring means measures the positional change of a pattern image forming surface on said reticle through said optical system.

17. The apparatus according to claim 13, wherein said reticle position measuring means applies a light beam to a surface of said reticle facing the wafer, receives the light beam reflected from the surface and measures the positional change of the reticle from the light beam received.

18. The apparatus according to claim 13, wherein said correcting means comprises driving means for changing the position of said wafer stage in the direction of the optical axis of said optical system, wafer position measuring means for measuring the positional change of said wafer to the direction of the optical axis of said optical system, controlling means for controlling said driving means in accordance with the measuring value obtained by said wafer position measuring means, and adjusting means having a calculation section for calculating a correction value to adjust the position of said wafer in the direction of the optical axis of said optical system in accordance with the measuring value obtained by said reticle position measuring means, so that said correction value is provided to said controlling means as an offset.

19. The apparatus according to claim 18, wherein said correcting means further includes driving means for changing the position of said reticle stage in the direction of the optical axis of said optical system, controlling means for controlling said driving means in accordance with the measuring value obtained by said reticle position measuring means, and adjusting means having a calculation section for calculating a correction value to adjust the position of said reticle in the direction of the optical axis of said optical system in accordance with the measuring value obtained by said reticle position measuring means.

20. The apparatus according to claim 18, wherein said correcting means further includes driving means for changing the position of said optical system in the direction of the optical axis, controlling means for controlling said driving means in accordance with the measuring value obtained by said reticle position measuring means, and adjusting means having a calculation section for calculating a correction value to adjust the position of said optical system in the direction of the optical axis in accordance with the measuring value obtained by said reticle position measuring means.

21. The apparatus according to claim 18, wherein said adjusting means comprises a storing means for storing a correction value in advance when the pattern image on the reticle is preliminarily scan-exposed.

22. An optical exposure apparatus of a scan-exposure system, comprising:
an optical system for reduction-projecting a pattern image formed on a reticle onto an exposure surface of a wafer;
a reticle stage, mounting said reticle thereon, provided to be movable in the direction of the optical axis of said optical system and a scanning direction perpendicular to the direction of the optical axis of said optical system;
a wafer stage, mounting said wafer thereon, provided to be movable in at least the scanning direction perpendicular to the direction of the optical axis of said optical system;
reticle position measuring means for measuring the positional change of a surface of a pattern image forming portion of said reticle in the direction of the optical axis of said optical system as said reticle stage is moved in the scanning direction; and
correcting means for correcting the position of at least said reticle in the direction of the optical axis of said optical system based on the measuring value obtained by said reticle position measuring means.

23. The apparatus according to claim 22, wherein said reticle position measuring means measures the positional change of said reticle at at least one point.

24. The apparatus according to claim 22, wherein said reticle position measuring means optically measures the positional change of a pattern image forming surface on said reticle.

25. The apparatus according to claim 22, wherein said reticle position measuring means measures the positional change of a pattern image forming surface on said reticle through said optical system.

26. The apparatus according to claim 22, wherein said reticle position measuring means applies a light beam to a surface of said reticle facing the wafer, receives the light beam reflected from the surface and measures the positional change of the reticle from the light beam received.

27. The apparatus according to claim 22, wherein said correcting means comprises driving means for changing the position of said reticle stage in the direction of the optical axis of said optical system, controlling means for controlling said driving means in accordance with the measuring value obtained by said reticle position measuring means, and adjusting means having a calculation section for calculating a correction value to adjust the position of said reticle in the direction of the optical axis of said optical system in accordance with the measuring value obtained by said reticle position measuring means, so that said correction value is provided to said controlling means as an offset.

28. The apparatus according to claim 27, wherein said correcting means further includes driving means for changing the position of said wafer stage in the direction of the optical axis of said optical system, controlling means for controlling said driving means in accordance with the measuring value obtained by said reticle position measuring means, and adjusting means having a calculation section for calculating a correction value to adjust the position of said wafer in the direction of the optical axis of said optical system in accordance with the measuring value obtained by said reticle position measuring means.

29. The apparatus according to claim 27, wherein said correcting means further includes driving means for changing the position of said optical system in the direction of the optical axis, controlling means for controlling said driving means in accordance with the measuring value obtained by said reticle position measuring means, and adjusting means having a calculation section for calculating a correction value to adjust the position of said optical system in the direction of the optical axis in accordance with the measuring value obtained by said reticle position measuring means.

30. The apparatus according to claim 27, wherein said adjusting means comprises a storing means for storing a correction value in advance when the pattern image on the reticle is preliminarily scan-exposed.

31. An optical exposure apparatus of a scan-exposure system comprising:
- an optical system for reduction-projecting a pattern image formed on a reticle onto an exposure surface of a wafer;
- a reticle stage, mounting said reticle thereon, provided to be movable in at least a scanning direction perpendicular to the direction of the optical axis of said optical system;
- a wafer stage, mounting said wafer thereon, provided to be movable in at least the scanning direction perpendicular to the direction of the optical axis of said optical system;
- reticle position measuring means for measuring the positional change of a pattern image forming portion of said reticle in the direction of the optical axis of said optical system as said reticle stage is moved in the scanning direction; and
- correcting means for correcting the position of at least said optical axis based on the measuring value obtained by said reticle position measuring means.

32. The apparatus according to claim 31, wherein said reticle position measuring means measures the positional change of said reticle at at least one point.

33. The apparatus according to claim 31, wherein said reticle position measuring means optically measures the positional change of a pattern image forming surface on said reticle.

34. The apparatus according to claim 31, wherein said reticle position measuring means measures the positional change of a pattern image forming surface on said reticle through said optical system.

35. The apparatus according to claim 31, wherein said reticle position measuring means applies a light beam to a surface of said reticle facing the wafer, receives the light beam reflected from the surface and measures the positional change of the reticle from the light beam received.

36. The apparatus according to claim 31, wherein said correcting means comprises driving means for changing the position of said optical system in the direction of the optical axis, controlling means for controlling said driving means in accordance with the measuring value obtained by said reticle position measuring means, and adjusting means having a calculation section for calculating a correction value to adjust the position of said optical system in the direction of the optical axis in accordance with the measuring value obtained by said reticle position measuring means, so that said correction value is provided to said controlling means as an offset.

37. The apparatus according to claim 36, wherein said correcting means further includes driving means for changing the position of said wafer stage in the direction of the optical axis of said optical system, controlling means for controlling said driving means in accordance with the measuring value obtained by said reticle position measuring means, and adjusting means having a calculation section for calculating a correction value to adjust the position of said wafer in the direction of the optical axis of said optical system in accordance with the measuring value obtained by said reticle position measuring means.

38. The apparatus according to claim 36, wherein said correcting means further includes driving means for changing the position of said reticle in the direction of the optical axis of said optical system, controlling means for controlling said driving means in accordance with the measuring value obtained by said reticle position measuring means, and adjusting means having a calculation section for calculating a correction value to adjust the position of said reticle in the direction of the optical axis of said optical system in accordance with the measuring value obtained by said reticle position measuring means.

39. The apparatus according to claim 36, wherein said adjusting means comprises a storing means for storing a correction value in advance when the pattern image on said reticle is preliminarily scan-exposed.

* * * * *